United States Patent [19]
White

[11] Patent Number: 4,811,262
[45] Date of Patent: Mar. 7, 1989

[54] DISTRIBUTED ARITHMETIC REALIZATION OF SECOND-ORDER NORMAL-FORM DIGITAL FILTER

[75] Inventor: Stanley A. White, San Clemente, Calif.

[73] Assignee: Rockwell International Corporation, El Segundo, Calif.

[21] Appl. No.: 909,750

[22] Filed: Sep. 19, 1986

[51] Int. Cl.⁴ .................................................. G26F 7/38
[52] U.S. Cl. .................................................. 364/724.01
[58] Field of Search ................... 364/724, 728; 375/42, 375/12, 82, 94

[56] References Cited

U.S. PATENT DOCUMENTS

| | | | |
|---|---|---|---|
| 4,450,533 | 5/1984 | Petit et al. | 364/724 |
| 4,454,590 | 6/1984 | Belt et al. | 364/724 |
| 4,521,866 | 6/1985 | Petit et al. | 364/724 |

OTHER PUBLICATIONS

Peled and Liu, Digital Signal Processing: Theory, Design, and Implementation, pp. 212-260, 1976.
Barnes, Casper W., "A Parametric Approach to the Realization of Second-Order Digital Filter Sections," IEEE Transactions of Circuits & Systems, vol. CAS-32, No. 6, Jun. 1985.
Tran, Boi N., "Cad Approach to Realize a Second-Order Digital Filter Sections" (unpublished), dated 2/12/86.
Tran, Boi N., "A Preliminary Study of Architectures for a State-Space Digital Filter" (unpublished), dated 2/12/86.

*Primary Examiner*—Gary V. Harkcom
*Assistant Examiner*—Long Thang Nguyen
*Attorney, Agent, or Firm*—H. Fredrick Hamann; George A. Montanye; James F. Kirk

[57] ABSTRACT

A high-speed distributed-arithmetic realization of a second-order normal-form digital filter includes a filter input, a filter output, and a memory. The memory has a first input, a second input, and a third input. The first memory input is connected to the filter input. The memory also has a first output, a second output, and a third output. The digital filter additionally includes a first adder having an input connected to the first memory output, and having its output connected to the filter output. A second adder has an input connected to the second memory output, and has its output connected to the second memory input. A third adder has an input connected to the third memory output and has its output connected to the third memory input.

29 Claims, 9 Drawing Sheets

4,811,262

DISTRIBUTED ARITHMETIC REALIZATION OF SECOND-ORDER NORMAL-FORM DIGITAL FILTER

BACKGROUND OF THE INVENTION

The present invention relates to digital filters, and specifically to second-order digital filters. It is well known that any order of digital filters may be efficiently constructed from second-order building blocks.

Direct mechanization of digital filters is well understood by those skilled in the digital-filter art. The direct mechanization of a second-order digital filter requires five multipliers. Each multiplier used in the direct mechanization of the filter introduces round-off noise into the result because only a finite number of bits of the product can be carried forward. In addition, coefficient error is introduced because each multiplier coefficient is a finite number, having a finite number of bits. Therefore, the poles and zeros of the filter implemented in the direct form are not exact.

The normal-form of the second-order digital filter provides a digital filter structure with lower round-off noise, minimum coefficient inaccuracy errors, and an absence of limit cycles. Such a normal-form filter is described in the article by C. W. Barnes, "A Parametric Approach to the Realization of Second Order Digital Filter Sections", *IEEE Trans. on Circuit and System*, Vol. CAS-32 No. 6, June 1985, pages 530-539.

The normal-form filter provides better coefficient error and round-off error because inherent error correction is provided by the cross-coupling of the partial-product outputs within the filter.

A block diagram of the conventional second-order normal-form digital filter structure is shown in FIG. 1. The filter has an input 11 for receiving an input signal X, which may consist of a series of N-bit signal samples, $x_n$. The signal is processed through a plurality of multipliers to produce intermediate results U and V the final result Y. The final result Y is placed on the filter output as the output signal. The intermediate results U and V are fed back and cross-coupled within the filter. The multipliers $b_1$, $b_2$, $c_1$, and $c_2$ determine the locations of the poles of the filter. The input multipliers $a_1$ and $a_2$ determine the input scaling. Once the other coefficients have been set, the multipliers $a_0$, $d_1$, and $d_2$ determine the zero locations of the filter. The second-order normal-form filter has a total of nine multipliers. Element-by-element mechanizations of this filter, sometimes with variations as taught by Barnes, represents the prior art.

Nevertheless, the normal-form digital filter provides design difficulties for implementation and also is difficult to analyze. In addition, the large number of multipliers occupies a great deal of space on a semiconductor chip when this filter is implemented in microcircuitry. Therefore, efforts have been undertaken to reduce the number of multipliers in the second-order normal-form digital filter.

SUMMARY OF THE INVENTION

The present invention greatly simplifies the second-order normal-form digital filter while providing increased accuracy by entirely eliminating the multipliers, and substituting one or more look-up tables stored in memory to provide partial-product outputs, which are subsequently summed and recursively used to address the memory.

The digital filter includes a filter input and a filter output. A memory has a first memory input connected to the filter input, and second and third inputs. The memory has a first output, a second output, ad a third output. A first adder has an input connected to the first memory output, and has its output connected to the filter output. A second adder has an input connected to the second memory output, and has its output connected to the second memory input. A third adder has an input connected to the third memory output and has its output connected to the third memory input.

DETAILED DESCRIPTION OF THE PREFERRED EMBODIMENTS

The present invention entirely eliminates the multipliers of the normal-form digital filter by the use of distributed arithmetic to replace the multipliers with one or more memories containing look-up tables to produce each of the partial-products within the filter.

Distributed arithmetic (DA) is a bit-serial computational operation that forms the inner (dot) products of vectors in a single direct step.

Figure 2:
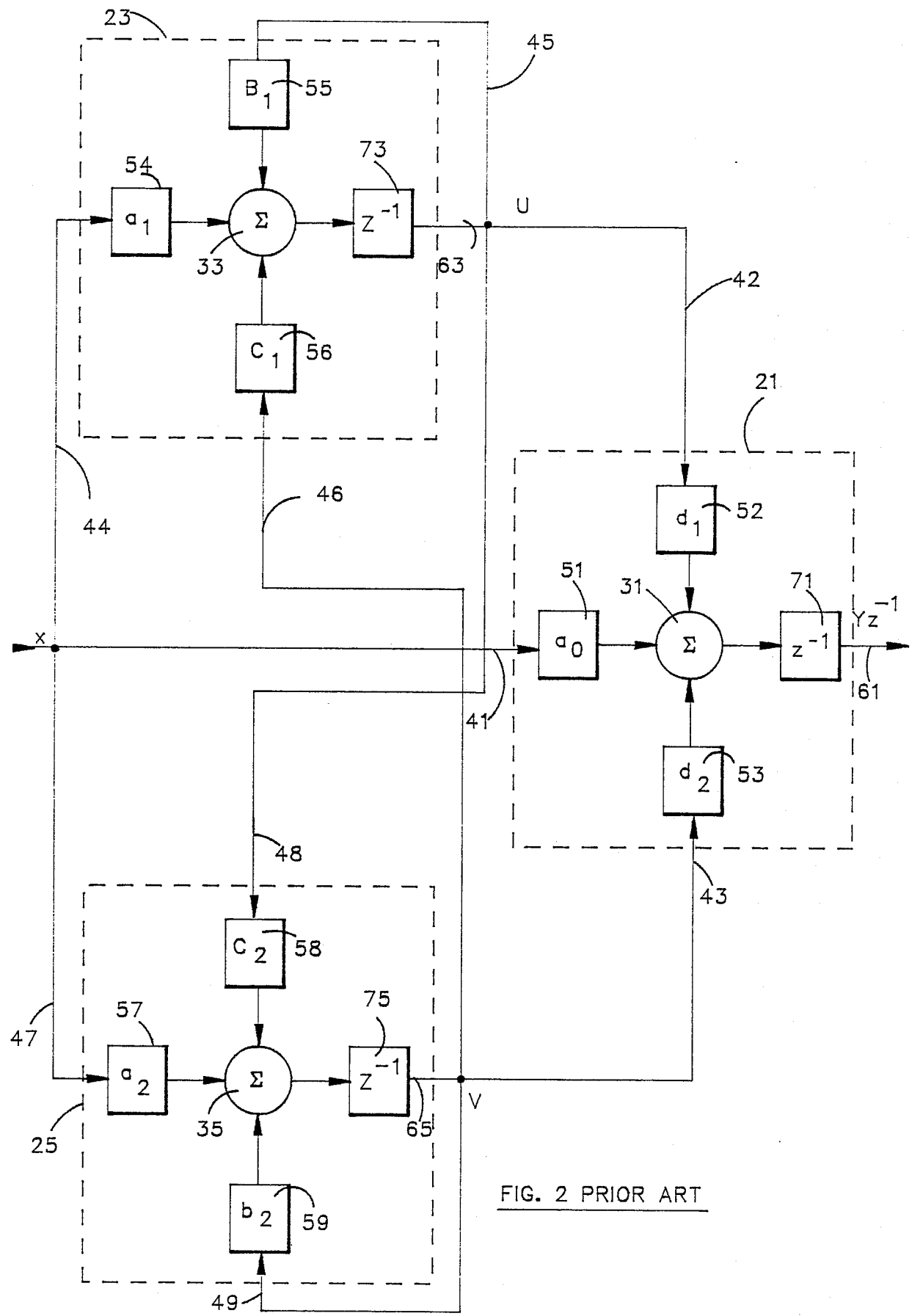
FIG. 2 is a recharacterization of the normal-form digital filter shown in FIG. 1.

The present invention is possible because the functions of the normal-form digital filter can be grouped into three similar blocks 21, 23, 25 in the manner shown in FIG. 2. Each block includes a summer or adder 31, 33, 35, three inputs 41–49 to the summer, a multiplier 51–59 on each input, and an output 61, 63, 65 from the summer 31, 33, 35 with a delay element 71, 73, 75. Each block 21, 23, 25 produces a dot product Y, U, and V. Each block also has as inputs the intermediate products U and V and the filter input signal X. Thus, in each block, each of the signals X, U, and V is multiplied by a weighting coefficient, and then summed and delayed by one sample time to produce the product. Each of these products can be obtained using a distributed arithmetic table look-up approach.

If each signal X, U, V, Y at a point in time has a multi-bit sample $x_n$, $u_n$, $v_n$, $y_n$, and at the immediately preceding sample clock period has a sample $x_{n-1}$, $u_{n-1}$, $v_{n-1}$, $y_{n-1}$, the configuration shown in FIG. 2 can be expressed mathematically as follows:

$$u_n = a_1 x_{n-1} + b_1 u_{n-1} + c_1 v_{n-1} \qquad (1)$$

$$v_n = a_2 x_{n-1} + c_2 u_{n-1} + b_2 v_{n-1} \quad (2)$$

$$y_n = a_0 x_{n-1} + d_1 u_{n-1} + d_2 v_{n-1} \quad (3)$$

In vector-matrix notation, Equations (1)-(3) may be expressed:

$$\begin{bmatrix} u_n \\ v_n \\ y_n \end{bmatrix} = \begin{bmatrix} a_1 & b_1 & c_1 \\ a_2 & c_2 & b_2 \\ a_0 & d_1 & d_2 \end{bmatrix} \begin{bmatrix} x_{n-1} \\ u_{n-1} \\ v_{n-1} \end{bmatrix} \quad (4)$$

Figure 3:
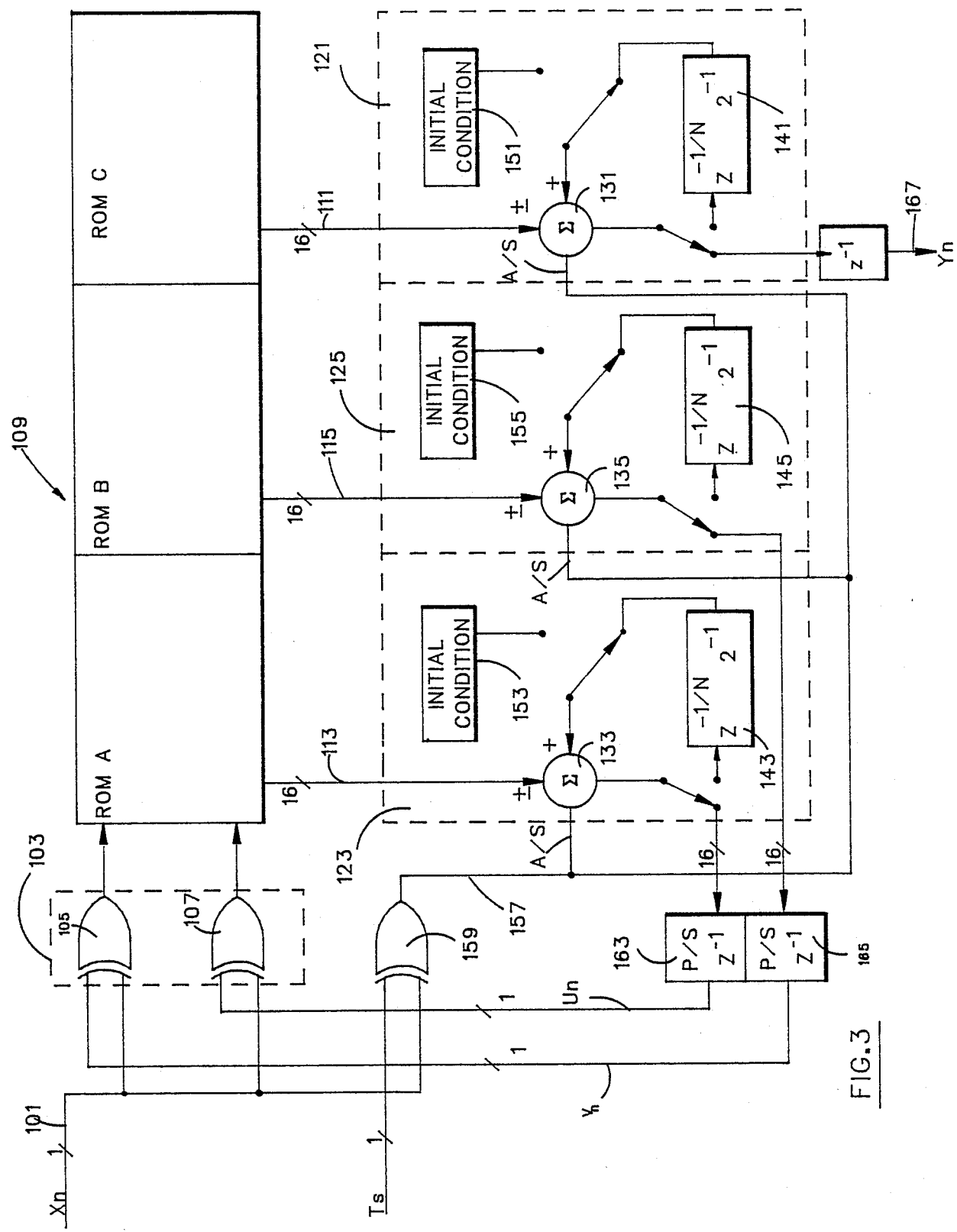
FIG. 3 shows a one-bit-at-a-time distributed arithmetic realization of a normal-form biquadratic digital filter incorporating the invention.

FIG. 3 shows a distributed arithmetic realization of a normal-form biquadratic digital filter for one-bit-at-a-time processing. The filter input 101 receives the input signal sample $x_n$. Each such signal sample may consist of N bits. In the illustrated embodiment, the bits of the input signal sample $x_n$ are received serially, one bit at a time.

An addressing mechanism 103 receives the input signal sample $x_n$ and the recursive intermediate results $u_n$ and $v_n$ to generate an address for the product memory. In the embodiment shown, the recursive intermediate results $u_n$ and $v_n$ are also applied to the addressing mechanism serially, following a parallel-to-serial conversion in the feedback paths. The addressing mechanism 103 comprises exclusive-OR gates 105, 107, each of which receives the serially input signal $x_n$ and one of the serially input intermediate results $u_n$ or $v_n$. The outputs of the exclusive-OR gates 105, 107 form the address for the partial product memory 109. The term "memory" refers to the combination of the partial-product memory 109 and the addressing logic 103.

The memory 109 may be any type of multi-bit digital storage device, such as a Read-Only-Memory (ROM). The memory has stored in it the partial-products of u, v, y that, when weighted by the factor $2^{-n}$ and summed, form the intermediate and final results $u_n$, $v_n$, $y_n$ for each set of bits of the input signals $x_{n-1}$, $u_{n-1}$, $v_{n-1}$. Single addressing of the memory for all three partial products can be used, as the same three input signals X, U, and V are input to each computation block 21, 23, 25 (FIG. 2). As there are three signal inputs to form the address for the memory, four values or words for each partial-product of u, v, y must be stored in the memory 109, as $\frac{1}{2} \times 2^3 = 4$.

At each address in the memory are stored the partial-products that are required to form the results $u_n$, $v_n$, $y_n$ for that set of inputs. In the drawing, the ROM is conceptualized as comprising three parts, ROM A, ROM B, and ROM C. In this conceptualization, the partial-product values to form u are stored in the memory portion ROM A, the partial-product values to form v are stored in the memory portion ROM B, and the partial-product values to form y are stored in the memory portion ROM C. A scaling factor of $-\frac{1}{2}$ is included in each partial-product.

The four words that are stored in memory portion ROM A for the partial-products that form $u_n$ are:

$$-\tfrac{1}{2}(a_1 + b_1 + c_1) \quad (5)$$

$$-\tfrac{1}{2}(a_1 + b_1 - c_1) \quad (6)$$

$$-\tfrac{1}{2}(a_1 - b_1 + c_1) \quad (7)$$

$$-\tfrac{1}{2}(a_1 - b_1 - c_1) \quad (8)$$

The four words stored in memory portion ROM B for the partial-products that form $v_n$ are:

$$-\tfrac{1}{2}(a_2 + c_2 + b_2) \quad (9)$$

$$-\tfrac{1}{2}(a_2 + c_2 - b_2) \quad (10)$$

$$-\tfrac{1}{2}(a_2 - c_2 + b_2) \quad (11)$$

$$-\tfrac{1}{2}(a_2 - c_2 - b_2) \quad (12)$$

The four words stored in the memory portion ROM C for the partial-products that form $y_n$ are:

$$-\tfrac{1}{2}(a_0 + d_1 + d_2) \quad (13)$$

$$-\tfrac{1}{2}(a_0 + d_1 - d_2) \quad (14)$$

$$-\tfrac{1}{2}(a_0 - d_1 + d_2) \quad (15)$$

$$-\tfrac{1}{2}(a_0 - d_1 - d_2) \quad (16)$$

The corresponding words for each partial-product of $u_n$, $v_n$, $y_n$ have the same address. Consequently, the corresponding partial-product values are read out when a single address is applied to the memory. In the example provided above, the words (5), (9), and (13) have the same address. The words (6), (10), and (14) also have the same address, and so forth.

Ideally, the three corresponding partial-products simply form a single word at a single location of the memory, so that the divisions of ROM A, ROM B, and ROM C are purely conceptual. In the example shown, there are four words stored in the memory, each consisting of the three partial-products. Each partial-product portion of the addressed stored word is read out onto its own memory output lines 111, 113, 115. The partial products of $y_n$ are placed on the output 111. The partial products of $u_n$ are placed on the output 113, while the partial products of $v_n$ are placed on the output 115. In the example shown, each partial-product consists of 16 bits. Therefore, a $3 \times 16 = 48$-bit word is stored at each address of the ROM. Thus, the total memory requirement is $4 \times 48 = 192$ bits.

A 16-bit partial-product is produced on each 16-bit memory output line 111, 113, 115 each bit period, for each bit of the input signal sample word $x_n$. A connecting or adding mechanism 121, 123, 125 comprising a summer 131, 133, 135, a shift/delay register 141, 143, 145, and an initial-condition register 151, 153, 155 is connected to each memory output 111, 113, 115 to generate the intermediate results $u_n$ and $v_n$ and the final product $y_n$ for each sample word $x_n$ of the input signal.

Each partial-product output is applied on a 16-bit parallel line 111, 113, 115 to a summer 131, 133, 135. In the summer the partial-product is added to or subtracted from the contents of the initial condition register 151, 53, 155 during the first bit clock time, when the least significant bit of $x_n$ is received. During the remaining clock times, the partial product output is added to or subtracted from a delayed and bit-shifted prior output for that partial-product output. The state of the Add-/Subtract (A/S) line 157 controlling the summers determines whether the partial-product memory outputs are added or subtracted in the summer 131, 133, 135. The Add/Subtract signal is the output of a third exclusive-OR gate 159 having as its inputs the input signal $x_n$ and a timing signal $T_s$. The timing signal is a pulse having a value 1 when the sign bit of the sample $x_n$ is being received, and is otherwise at a 0 level. When the signal on the Add/Subtract line 157 is 0, the summer is instructed to ado the partial-product emory output, while if the A/S signal is 1, the summer is instructed to subtract the partial-product memory output.

Each summed partial-product output from the summers 31, 133, 135 is bit-shifted one bit space and delayed one bit period in a delay/shift unit 141, 143, 145 and added to the partial-product memory output to form the aggregate of sums and thus form the intermediate results $u_n$ and $v_n$, and the final result $y_n$ for the input sample word $x_n$. As there are N bits in each input signal word $x_n$, each bit period is (1/N)th the word or sample period. The bit shift is to the right in the present example, as each successive memory output corresponds to the next-most significant bit of the input signal sample $x_n$ and of the recirculated intermediate results $u_n$ and $v_n$ generated during the immediately preceding sample time.

To provide the initial conditions for when the first, least-significant bit of each input sample $x_n$ appears on the input line, an initial-condition register 151, 153, 155 stores the initial-condition partial-product values $-\frac{1}{2}(a_0+d_1+d_2)$ for y, $-\frac{1}{2}(a_1+b_1+c_1)$ for u, and $-\frac{1}{2}(a_2+c_2+b_2)$ for v. A switch causes the initial conditions for the products $y_n$, $u_n$, and $v_n$, to be input to the summers 131, 133, 135. After the initial condition partial-product has been applied to the summers, the switches are returned to the state in which the delayed and bit-shifted partial-products output from the delay/shift units 141, 143, 145 are applied to their respective summers 131, 133, 135.

The final product output $y_n$ is applied to th system output 167, where it may appear delayed one word period because of processing time.

The intermediate results $u_n$ and $v_n$ are output from the adders 123, 125 and input to parallel-to-serial shift registers 163, 165 that also complete the one word or sample of the intermediate results $u_n$ and $v_n$. The resulting delayed partial product is then applied serially to the exclusive-OR gates 105, 107 of the addresser 103 along with the next input signal word during the subsequent sample period to address the memory 109.

Figure 4:
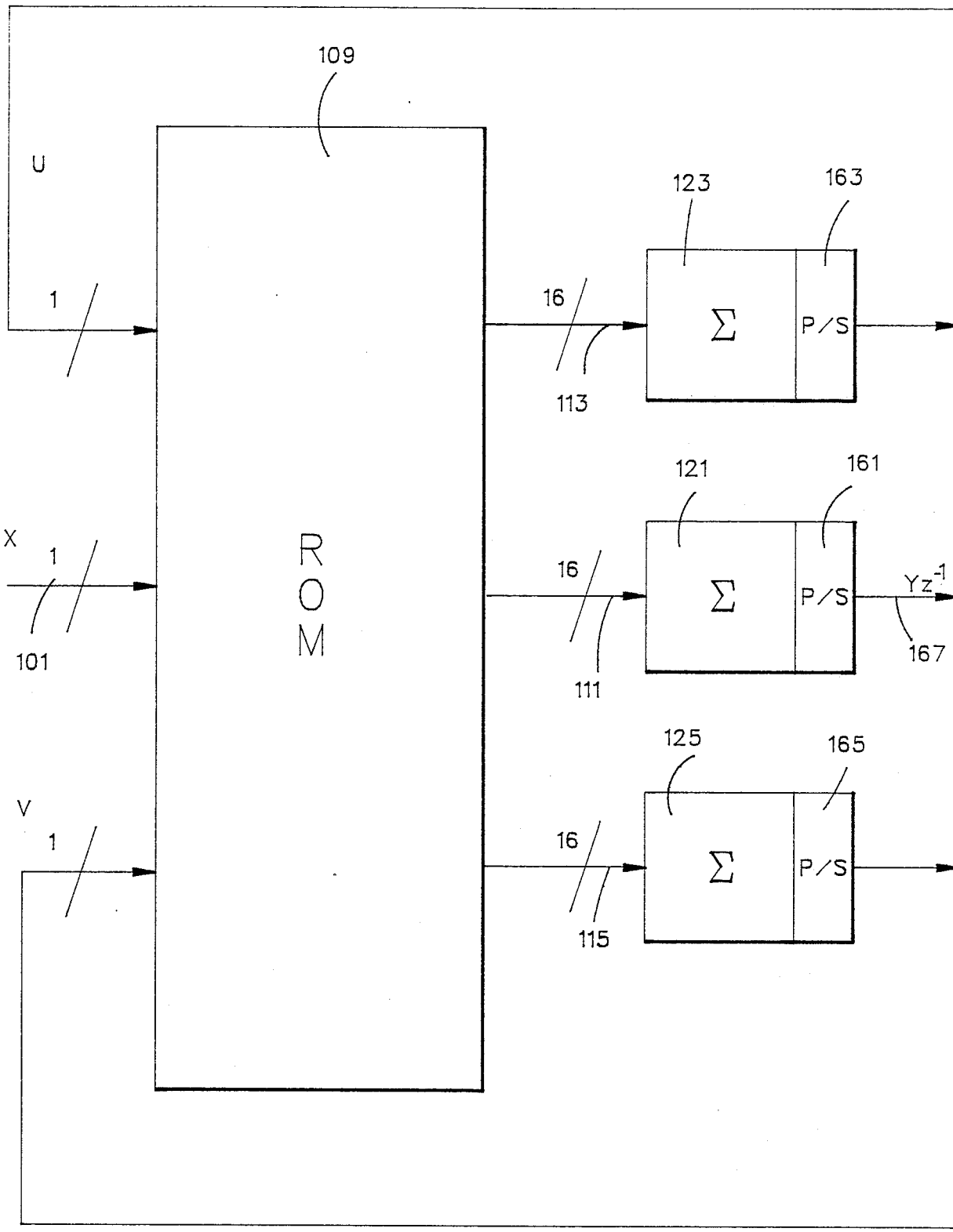
FIG. 4 shows a single memory one-bit-at-a-time digital filter incorporating the invention.

The device of FIG. 3 is shown in simplified form in FIG. 4, in which the single ROM 109 is addressed by one-bit signal lines. Each signal is represented by its more general symbol X, U, V, or Y. Again, the ROM 109 stores four words, each having 48 bits, to provide three 16-bit partial-products for the formation of the intermediate results U and V, and the final result Y. The three streams of serial data X, U, V are used to address the ROM, although the addressing circuitry itself is not shown. Three 16-bit output lines provide one line for each partial-product. One output bus 111 is for the partial-product for the output Y. The second output bus 113 is for the partial-product for the intermediate product U, and the third output bus 115 is for the partial-product for the intermediate result V. The partial-products output from the memory are summed and converted to serial data in the adders or summers 121, 123, 125 and parallel-to-serial shift registers 161, 163, 165.

The first summer 121 sums the partial-products output on the first memory output 111 to form each word of the final product Y. The second summer 123 combines the partial products on the second memory output 113 to form each word of the intermediate result U. The third summer 125 combines the partial-products on the third memory output 115 to form each word of the intermediate result V.

Each of the summers 121, 123, 125 shown in FIG. 4 incorporates the summer 131, 133, 135, shift/delay register 141, 143, 145, and initial condition register 151, 153, 155 shown in FIG. 3 for generating the aggregate sum for its associated partial-product. The parallel-to-serial registers 163, 165 correspond to the parallel-to-serial register shown in FIG. 3. The serialized and one-sample-time delayed intermediate products U and V are recursively applied to the memory addressing. The serialization of the filter output Y in the parallel-to-serial register 161 is optional.

Because the processor shown in FIGS. 3 and 4 operates on the input signal only one bit at a time, 16 clock cycles are required to perform the filtering function for each 16-bit input sample $x_n$ of the input signal X. To reduce or eliminate the delays caused by such bit-serial processing, parallel processing of the data bits can be employed in the filter structure incorporating the invention.

As mentioned above, distributed arithmetic is a bit-serial computational operation that forms the inner (dot) products in a single direct step. If the number of elements in each vector is commensurate with the number of bits in each vector element, the time required to input Q Q-bit words one at a time in parallel fashion is the same as the time required to process each of the Q words serially on Q parallel wires.

Figure 5:
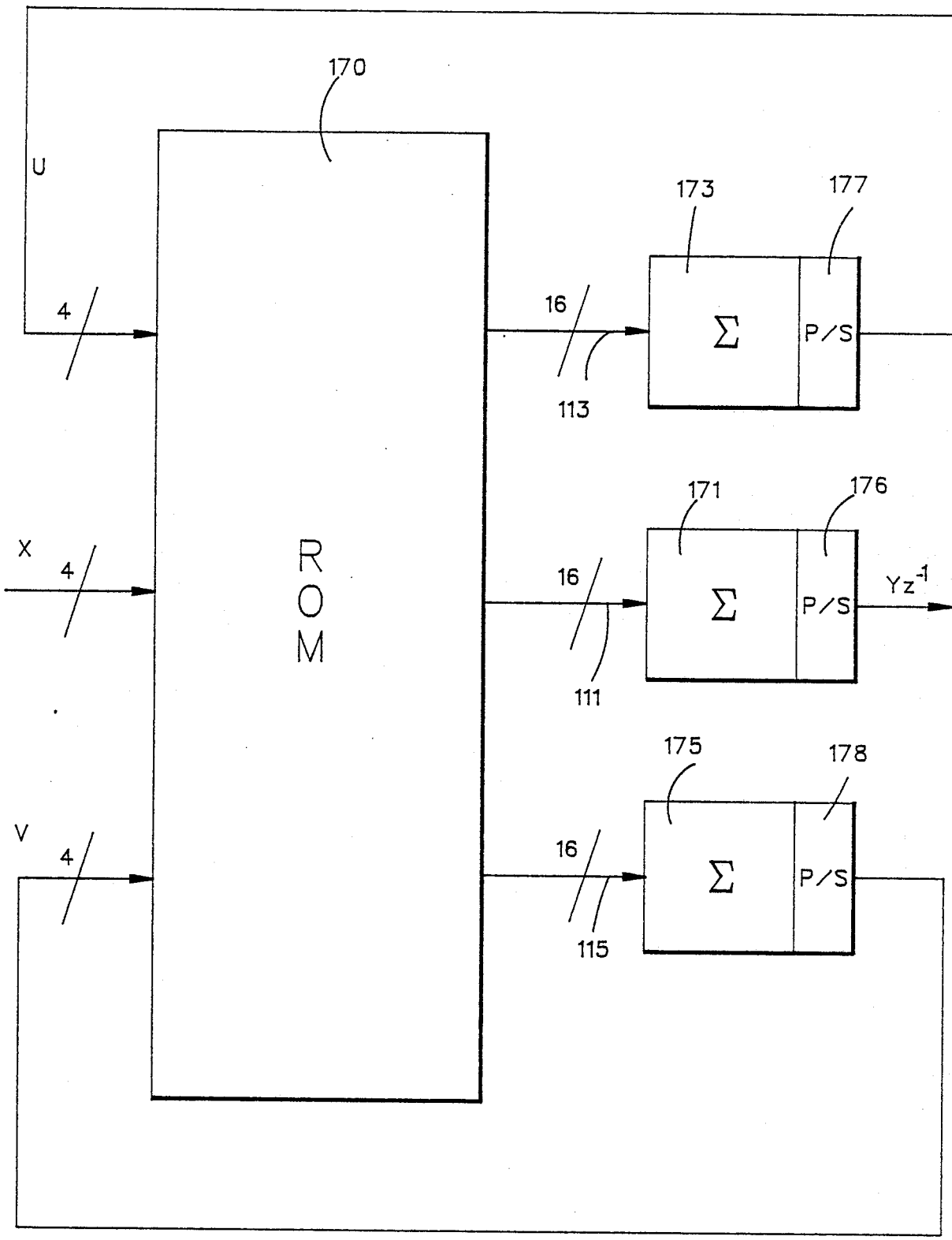
FIG. 5 shows a single memory four-bit-at-a-time digital filter incorporating the invention.

FIG. 5 illustrates an arrangement in which the speed of the processor may be increased by a factor of four by using the data four bits at a time. The input signal X, consisting of 16 bits per sample, and the intermediate products U and V are each applied four bits at a time to address the ROM 170. Because the input signals on the three input lines each consist of four bits, the memory required in the ROM is $\frac{1}{2} \times 2^{(3 \times 4)} = 2048$ words. As before, each stored word is 48 bits, comprising the three partial-products of 16 bits each necessary to form the final product Y and the intermediate products U and V. Thus, the total memory requirement is 98,304 bits. The tradeoff for this increased memory requirement is that the processing time has been reduced by a factor of four, to four clock periods per sample.

The ROM 170 outputs four partial products during each sample time interval for each of the intermediate results U and V and the final result Y. The partial products that form each result Y, U, V are combined in the summers 171, 173, 175 into 16-bit products Y, U, and V. Each 16-bit product is then converted to four 4-bit segments in a parallel-to-serial register 176, 177, 178.

Figure 6:
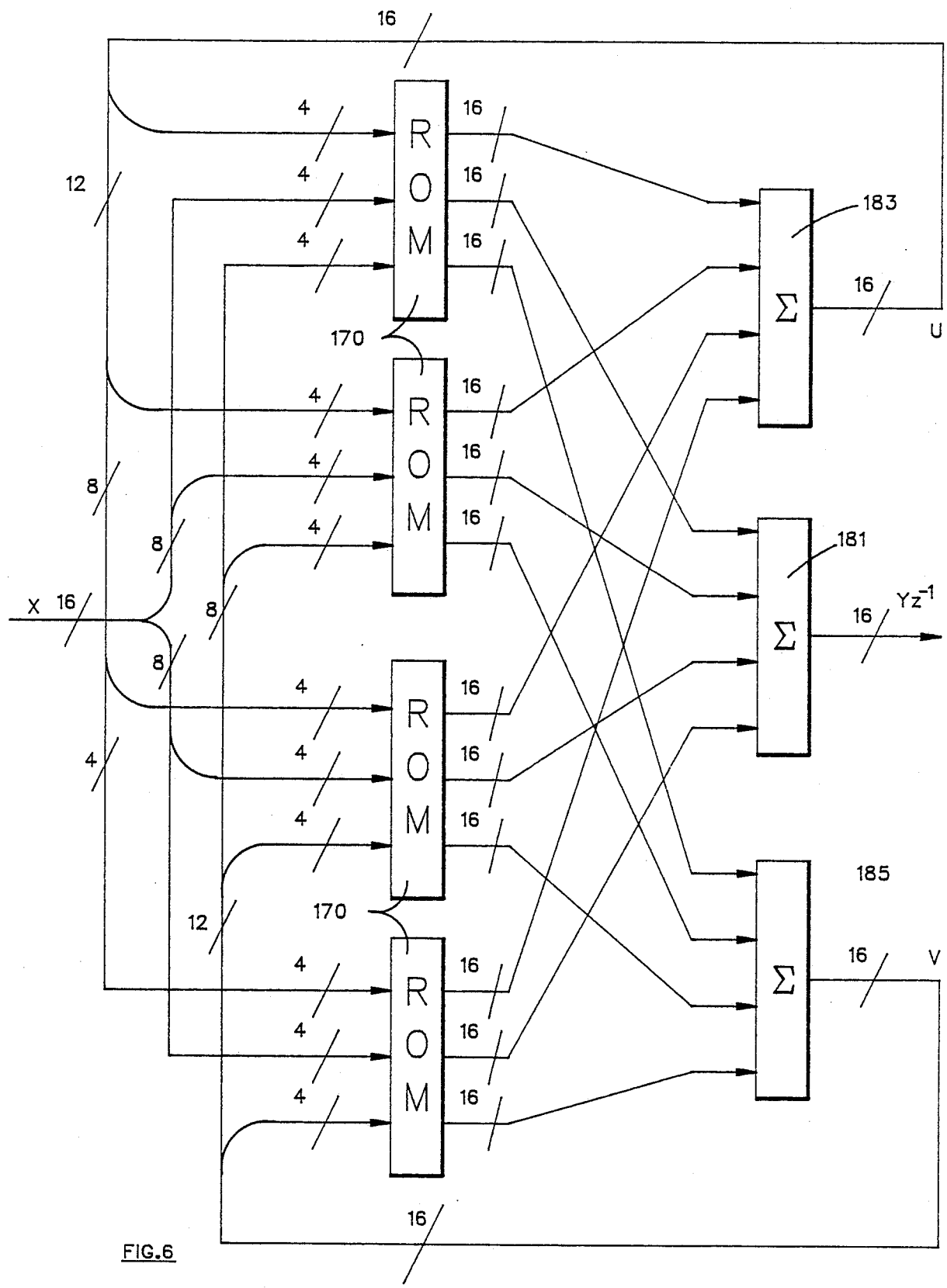
FIG. 6 shows a four memory sixteen-bit-at-a-time digital filter incorporating the invention using four-bit-at-a-time look-up tables.

A further reduction in the processing time can be achieved with the filter structure embodiment shown in FIG. 6. The input signal X is carried on a line 16 bits wide, for 16-bit parallel processing. The 16-bit input signal X can be split into four separate signals, each four bits wide, to address four identical ROMs 170. Each ROM is identical to the ROM of the filter structure of FIG. 5 and produces 16-bit partial-product outputs to form the products U, V, and Y.

Each of the 16-bit partial-product outputs from each of the ROMs is input to a separate one of three summers 181, 183, 185. Each summer combines the aggregate partial-products from the four separate memories 170 to obtain a single system product. As illustrated, each system product also consists of a 16-bit word.

A first summer 181 sums the partial products &rom each of the four memories that form the output Y to produce the system product output Y. A second summer 183 sums the partial products that form the intermediate result U from the four memories to produce a 16-bit second product U, and a third summer 185 adds the partial products that form the intermediate result V from the four memories.

The summers also delay the product signals one input signal sample period. Each of the second and third products U and V are split into four-bit segments, and used to address the memory in the manner described in connection with the structure of FIG. 5. Thus, the structure shown in FIG. 6 processes the filter function for a 16-bit input signal X in one clock period.

Figure 7:
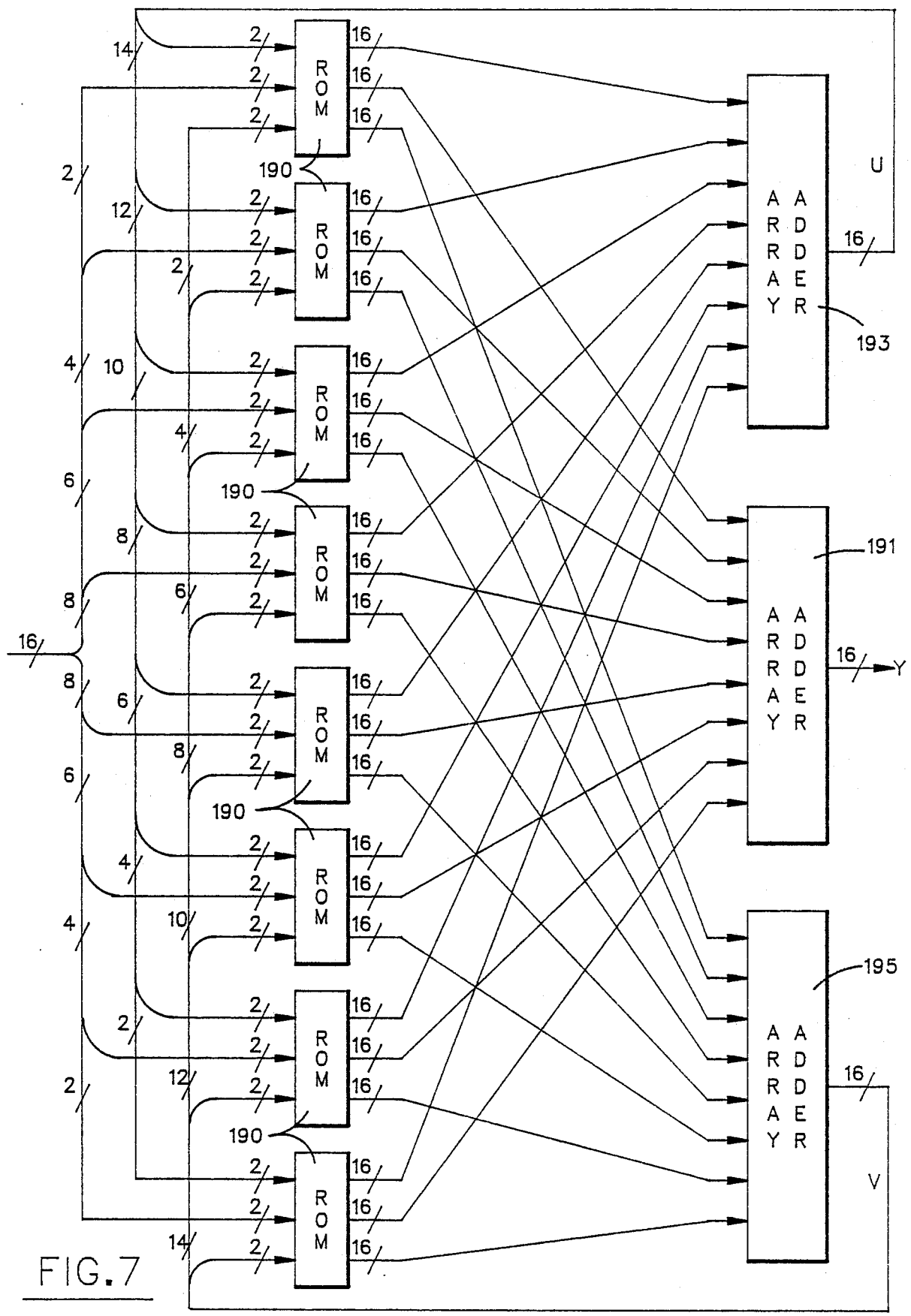
FIG. 7 shows an eight memory sixteen-bit-at-a-time digital filter incorporating the invention using two-bit-at-a-time look-up tables.

Because the system shown in FIG. 6 and described above requires each of the four ROMs 170 to contain 98,304 bits of storage, which may be more than conveniently available to a person constructing the system, an alternative embodiment shown in FIG. 7 only requires memories of 1536 bits, yet still performs the filter function on a 16-bit input signal in one clock period.

Eight ROMs 190 are connected in parallel, each addressed by a separate two-bit segment of the input signal X, and separate two-bit segments of each of the products U and V. Thus, 16 bits of the input signal X are still processed in parallel. Based on the address provided by the 2-bit segments of each of the input signal X and the products U and V, each ROM outputs 16-bit partial products to form U, V, and Y. With the three 2-bit inputs, each memory 190 has a storage capacity of $$\tfrac{1}{2} \times 2^{(3\times 2)} = 32 \text{ words}$$

As before, each stored word is 48 bits long, consisting of the three 16-bit partial-product portions. Therefore, each of the eight ROMs has a total capacity of 1536 bits. Three adder arrays 191, 193, 195 are arranged in parallel, each of which computes the products U, V, and Y from the partial-product portions from each memory. The first adder array 191 takes the Y partial-product output from each of the eight ROMs for summation into the single 16-bit system output Y. Similarly, the second array adder 193 takes the U partial-product output from each of the eight parallel ROMs to construct the system intermediate product U, and the third array adder 195 takes the V partial-product output from each of the ROMs to produce the system intermediate product V.

Following a one-clock-period (sample time) delay, each of the second and third system intermediate products U and V is split into eight two-bit segments. Each segment is used to address one of the eight ROMs 190.

The total memory for the system structure shown in FIG. 7 is 12,288 bits, which is substantially less than that required for each of the structures shown in FIGS. 5 and 6. The three adders 191, 193, 195 are each of the complexity of a 16-bit modified-Booth multiplier. Thus, the system of FIG. 7 reduces the memory size from the structures of FIGS. 5 or 6 at the expense of complicating the adders, although such adder arrays are known and widely used in the art without substantial difficulties, and in many environments, such a tradeoff yields substantial benefits.

In all of the embodiments shown in FIGS. 3–7, an error cancellation feedback loop may be incorporated in the adders to further reduce quantization noise effects, as taught by T. L. Chang and S. A. White in "An Error Cancellation Digital Filter Structure and It's Distributed Arithmetic Implementation", *IEEE Trans. on Circuits and Systems*, Vol. CAS-32 No. 4, Apr. 24, 1981, pages 352–55.

Each of the shift-and-add operations of the shift-/delay unit and summer of the filter apparatus such as shown in FIG. 3 drops out a least-significant-bit on each shift operation. The collection of such bits is the round-off error. Thus, if those bits can be saved, the true round-off error is available for error correction to further improve the performance of the filter.

The error associated with the formation of the product U may be designated $e_1$, and the error associated with the formation of the product V may be designated $e_2$. Error feedback can then be used to minimize the error propagation.

Figure 1:
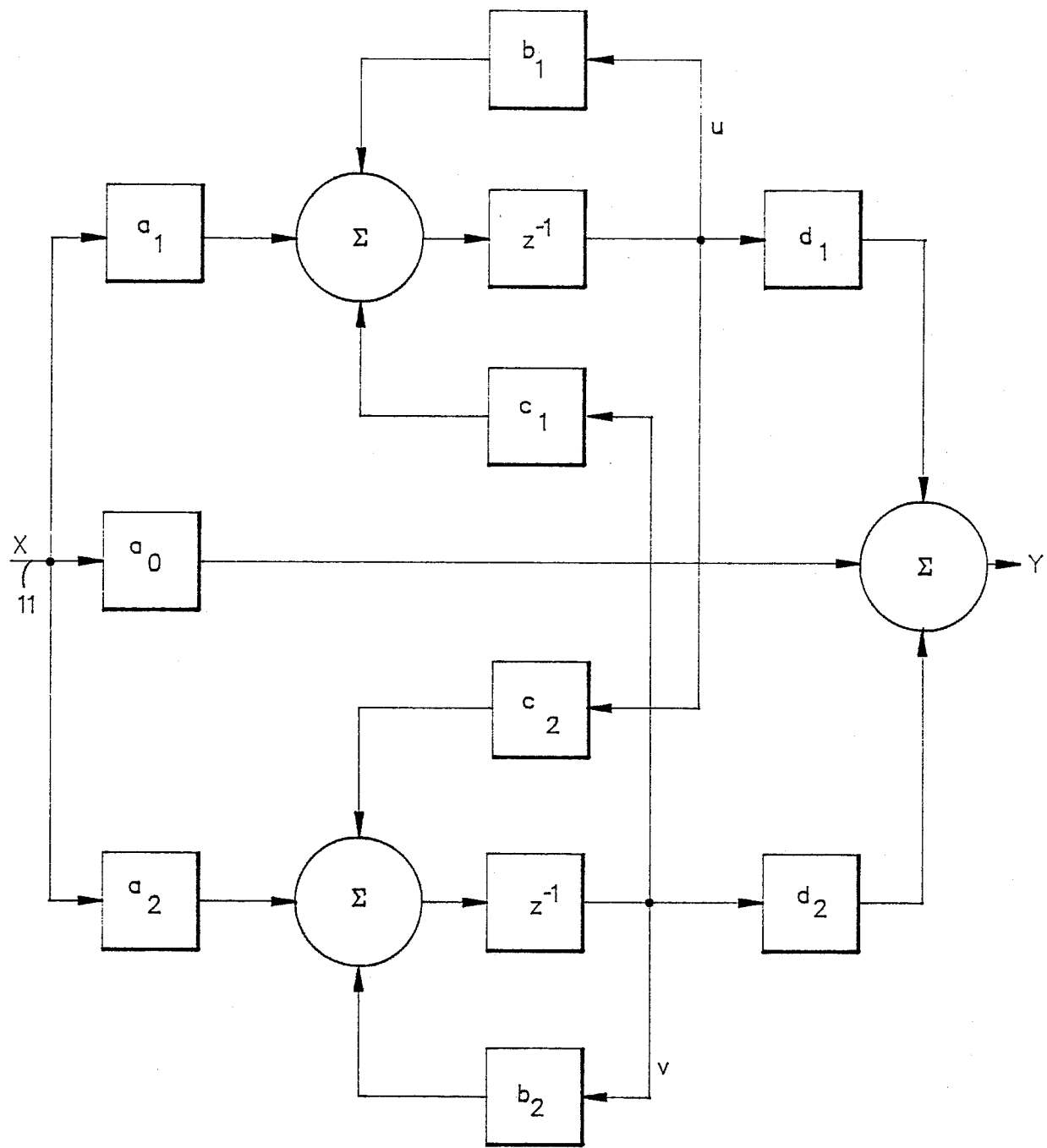
FIG. 1 is a block diagram of a second-order normal-form digital filter.
Figure 8:
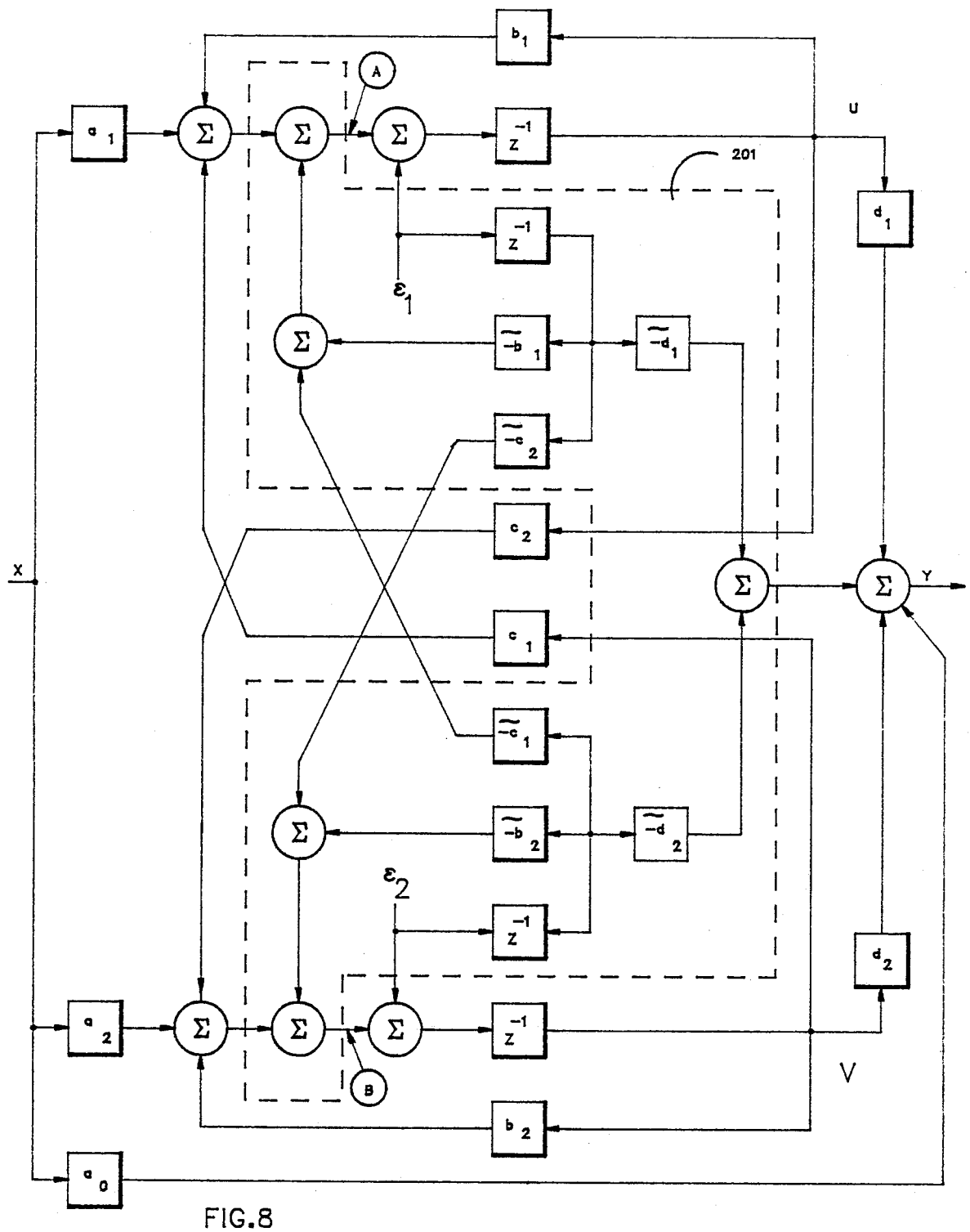
FIG. 8 shows a block diagram of the normal-form of a biquadratic digital filter with error feedback.

Referring to FIG. 8, the normal-form biquadratic digital filter shown in FIG. 1 is reproduced with the addition of error feedback/correction 201 as shown within the dashed perimeter. Following the open-loop propagation of the errors $e_1$ and $e_2$ to the points designated A and B, and to the system output Y, the noise is:

$$N_A(z) = e_1(z)(b_1 - \tilde{b}_1)z^{-1} + e_2(z)(c_1 - \tilde{c}_1)z^{-1}$$

$$N_B(z) = e_1(z)(c_2 - \tilde{c}_2)z^{-1} + e_2(z)(b_2 - \tilde{b}_2)z^{-1} \tag{18}$$

$$N_Y(z) = e_1(z)(d_1 - \tilde{d}_1)z^{-1} + e_2(z)(d_2 - \tilde{d}_2)z^{-1} \tag{19}$$

The values having tildes ($\tilde{b}_1, \tilde{c}_1, \tilde{c}_2, \tilde{d}_1, \tilde{d}_2$) are approximations designed to minimize the noise propagation with a minimum of arithmetic. Those approximations may be defined as follows:

$$\tilde{b}_1 = [\log_2 b_1] \text{ RNI} \tag{20}$$

$$\tilde{b}_2 = [\log_2 b_2] \text{ RNI} \tag{21}$$

$$\tilde{c}_1 = [\log_2 c_1] \text{ RNI} \tag{22}$$

$$\tilde{c}_2 = [\log_2 c_2] \text{ RNI} \tag{23}$$

$$\tilde{d}_1 = [\log_2 d_1] \text{ RNI} \tag{24}$$

$$\tilde{d}_2 = [\log_2 d_2] \text{ RNI} \tag{25}$$

The subscript "RNI" signifies that the value is rounded to the nearest integer.

Thus, the round-off errors $e_1$ and $e_2$ generated while forming the products U and V, respectively, during one sample time are used during the next sample time to approximately correct for the noise due to the round-off error during that next sample time.

Figure 9:
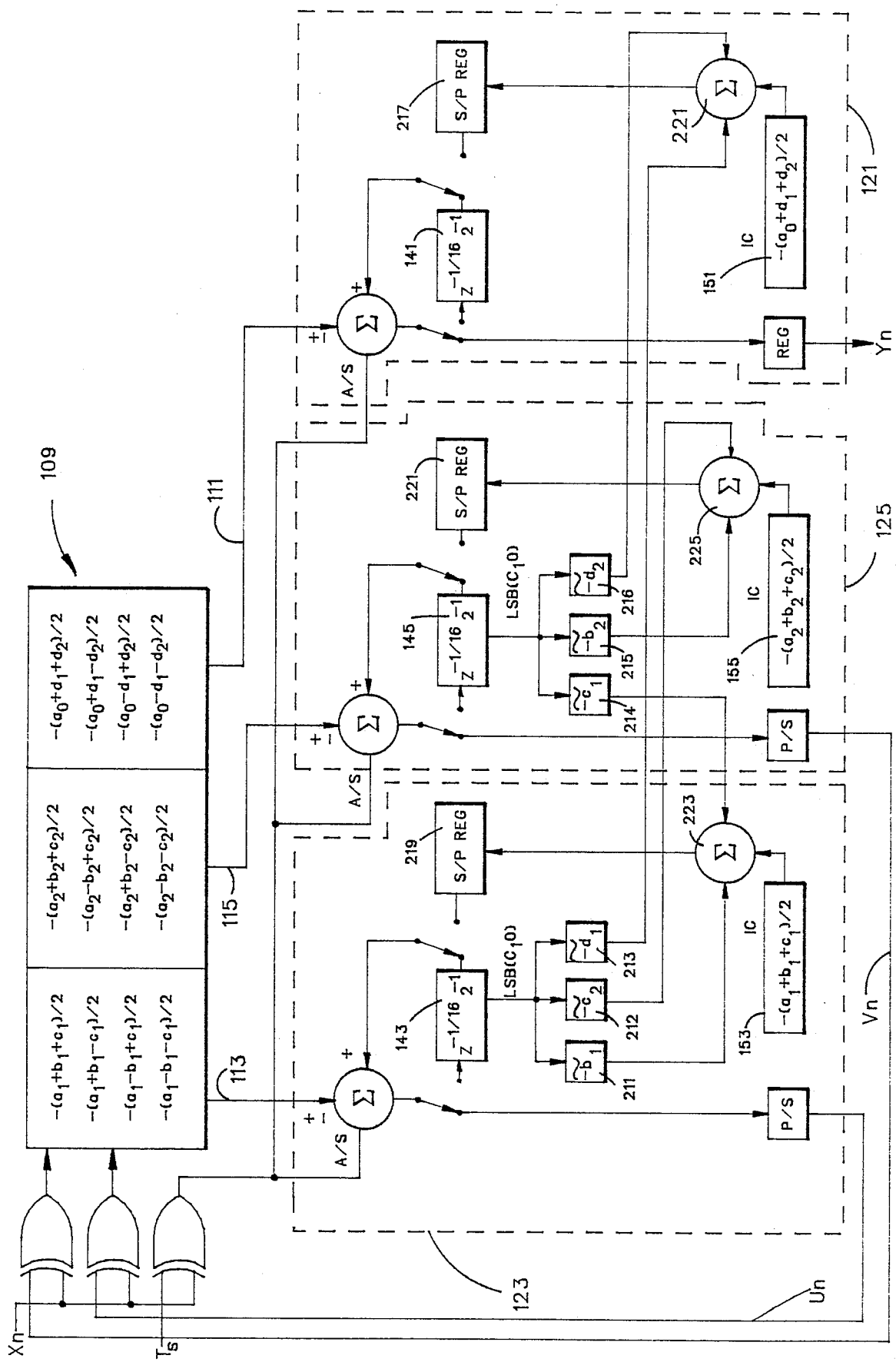
FIG. 9 shows a one-bit-at-a-time distributed arithmetic realization of a normal-form biquadratic digital filter with error feedback.

The filter with such error correction may be implemented as shown in FIG. 9. The filter of FIG. 9 is the same as the filter of FIG. 3, with the addition of the error correction mechanization. Each adding mechanism 121, 123, 125 includes an error correction mechanism for adding a correction to the first partial product output from the memory 109 on each of the memory outputs 111, 113, 115. The corrections are based on error estimates $e_1$ and $e_2$ generated in the second and third adders 123, 125 that form the internal results $u_n$ and $v_n$.

In the illustrated embodiment, the first error signal $e_1$, which is the error generated during the combination of the second partial products to form the intermediate results $u_n$, is multiplied by three corrective factors, $-\tilde{b}_1$, $-\tilde{c}_2$, and $-\tilde{d}_1$ to create three correction signals. The second error signal $e_2$, which is the error generated during the combination of the partial products to form the intermediate result $v_n$, is multiplied by three other correction factors, $-\tilde{c}_1$, $-\tilde{b}_2$, and $-\tilde{d}_2$ to create three additional correction signals. In implementation, the correction gain value multipliers $b_1$, $b_2$, $c_1$, $c_2$, $d_1$, and $d_2$ are at most a bit-shift, and thus are readily implemented.

The outputs of the first correction multiplier 211 for the first error $e_1$ and the first correction multiplier 214 for the second error $e_2$ become the correction for the adder 123 generating the intermediate product $u_n$. The outputs of the second correction multiplier 212 for the first error $e_l$ and the second correction multiplier 215 for the second error $e_2$ become the correction for the adder 125 generating the intermediate product $v_n$. The outputs of the third correction multiplier 213 for the first error $e_1$ and the third correction multiplier 216 for the second error $e_2$ become the correction for the adder 121 generating the filter output $y_n$.

In the preferred form illustrated, the adders 121, 123, 125 simultaneously add the initial conditions from the initial condition registers 151, 153, 155 and the correction signals to the partial products read out from the memory 109. This is accomplished in each adder 121, 123, 125 by adding in a secondary summer 221, 223, 225 the contents of the initial condition register 151, 153, 155 to the corrections output by the multipliers 211–216. The combined result is stored in a serial-to-parallel register 217, 219, 221. The correction signals and the initial conditions are combined and stored, in the serial-to-parallel registers 217, 219, 221 during one sample time or period, as the second and third adders 123, 125 generate the first and second error signals $e_1$, $e_2$. Then, as the least-significant-bit of the $x_n$ of the next sample time addresses the memory 109, the contents of each register 217, 219, 221 is added to the first partial product output on each of the lines 111, 113, 115.

If the error-correction mechanism shown within the dashed lines of FIG. 9 is redefined as an adder and a parallel-to-serial register, then the structure of the filter of FIG. 4 can be used to also provide error correction. If the adders fed by the initial conditions are L bit-at-a-time (such as 4 or 16) adders, then the error correction mechanism shown in FIG. 9 can be generalized for the filter structures shown in FIGS. 5–7.

I claim:
1. A digital filter comprising:
    a filter input;
    a filter output;
    a memory having a first input, a second input, and a third input, wherein said first memory input is connected to said filter input, said memory having a first output, a second output, and a third output;
    a first adder having at least one input connected to said first memory output, and having its output connected to said filter output;
    a second adder having at least one input connected to said second memory output and having its output connected to said second memory input; and
    a third adder having at least one input connected to said third memory output and having its output connected to said third memory input.
2. The digital filter of claim 1, wherein:
    said memory has stored in it a plurality of words comprising first, second, and third partial products;
    said first partial products are output on said first memory output;
    said second partial products are output on said second memory output; and
    said third partial products are output on said third memory output.
3. The digital filter of claim 2, wherein:
    said first adder combines a plurality of said first partial products to form a first product;
    said second adder combines a plurality of said second partial products to form a second product, and includes a first error estimator for accumulating bits dropped when said second adder forms said second product to generate a first error signal; and
    said third adder combines a plurality of said third partial products to form a third product, and includes a second error estimator for accumulating bits dropped when said third adder forms said third product to generate a second error signal.
4. The digital filter of claim 3, wherein:
    said first adder additionally includes first error correction means for adding a first correction signal to said first partial product to approximately compensate for error in said second and third products;
    said second adder additionally includes second error correction means for adding a second correction signal to said second partial product to approximately compensate for error in said second and third products;
    said third adder additionally includes third error correction means for adding a third correction signal to said third partial product to approximately compensate for error in said second and third products;
    said first correction signal comprises:
        said first error signal multiplied by a first factor; and
        said second error signal multiplied by a second factor;
    said second correction signal comprises:
        said first error signal multiplied by a third factor; and
        said second error signal multiplied by a fourth factor; and
    said third correction signal comprises:
        said first error signal multiplied by a fifth factor; and
        said second error signal multiplied by a sixth factor.
5. The digital filter of claim 4, wherein:
    said first adder additionally includes first initial condition means for adding a first initial condition to said first partial product;
    said second adder additionally includes second initial condition means for adding a second initial condition to said second partial product;
    said third adder additionally includes third initial condition means for adding a third initial condition to said third partial product.
6. The digital filter of claim 5, wherein:
    said first initial condition and said first correction signal are added together and stored in a first register;
    the output of said first register is added to said first partial product;
    said second initial condition and said second correction signal are added together and stored in a second register;
    the output of said second register is added to said second partial product;
    said third initial condition and said third correction signal are added together and stored in a third register; and
    the output of said third register is added to said third partial product.
7. The normal form digital filter of claim 6, wherein:
    said first initial condition and said first correction signal are added together and stored in said first register during a first sample interval;

the output of said first register is added to said first partial product during a second sample interval;

said second initial condition and said second correction signal are added together and stored in said second register during said first sample period;

the output of said second register is added to said second partial product during said second sample interval;

said third initial condition and said third correction signal are added together and stored in said third register during said first sample interval; and the output of said third register is added to said third partial product during said second sample interval.

8. A normal form digital filter comprising:
a filter input:
a filter output;
addressing means having a first input, a second input, and a third input, said addressing means generating a memory address in response to said first, second, and third inputs, wherein said first input is connected to said filter input;
a memory connected to the output of said addressing means, said memory including a plurality of addresses corresponding to the memory addresses generated by said addressing means, and having stored at each of said addresses first, second, and third partial products, said memory further including a first output for said first partial product, a second output for said second partial product, and a third output for said third partial product;
a first summer connected to said first memory output for combining a plurality of said first partial products to produce a first product, wherein the output of said first summer is connected to said filter output;
a second summer connected to said second memory output for combining a plurality of said second partial products to produce a second product, wherein the output of said second summer is connected to said second input of said addressing means; and
a third summer connected to said third memory output for combining a plurality of said third partial products to produce a third product, wherein the output of said third summer is connected to said third input of said addressing means.

9. The normal form digital filter of claim 8 wherein:
said first summer combines said plurality of first partial products over a single sample interval;
said second summer combines said plurality of second partial products over a single sample interval; and
said third summer combines said plurality of third partial products over a single sample interval.

10. The normal form digital filter of claim 8 additionally comprising:
a plurality of additional addressing means, each having a first input, a second input, and a third input, and each generating an address in response to its first, second, and third inputs, and wherein each said first input is connected to said filter input:
a plurality of additional memories, each of which is connected to the output of a corresponding one of said addressing means, each of said memories including a plurality of addresses and having stored at each of said addresses first, second, and third partial products, each of said memories further including a first output for said first partial product, a second output for said second partial product, and a third output for said third partial product;
wherein said first summer is connected to each of said first memory outputs for combining said first partial products to produce said first product;
wherein said second summer is connected to each of said second memory outputs for combining said second partial products to produce said second product; and
wherein said third summer is connected to each of said third memory outputs for combining said third partial products to produce said third product.

11. The normal form digital filter of claim 8, wherein:
said first summer includes first initial condition means for adding a first initial condition to said first partial product;
said second summer includes second initial condition means for adding a second initial condition to said second partial product;
said third summer includes third initial condition means for adding a third initial condition to said third partial product.

12. The normal form digital filter of claim 11, wherein:
said second summer additionally includes first estimating means for generating a first error signal comprising an estimate of the error in the second product; and
said third summer additionally includes second estimating means for generating a second error signal comprising an estimate of the error in the third product.

13. The normal form digital filter of claim 12, wherein:
said first summer additionally includes first error correction means for adding a first correction signal to said first partial product to approximately compensate for error in said second and third products;
said second summer additionally includes second error correction means for adding a second correction signal to said second partial product to approximately compensate for error in said second and third products; and
said third summer additionally includes third error correction means for adding a third correction signal to said third partial product to approximately compensate for error in said second and third products.

14. The normal form digital filter of claim 13, wherein:
said first initial condition means and said first error correction means simultaneously add said first initial condition and said first correction signal to said first partial product:
said second initial condition means and said second error correction means simultaneously add said second initial condition and said second correction signal to said second partial product; and
said third initial condition means and said third error correction means simultaneously add said third initial condition and said third correction signal to said third partial product.

15. The normal form digital filter of claim 14, wherein:
said first initial condition and said first correction signal are added together and stored in a first register;

the output of said first register is added to said first partial product;

said second initial condition and said second correction signal are added together and stored in a second register;

the output of said second register is added to said second partial product;

said third initial condition and said third correction signal are added together and stored in a third register; and the output of said third register is added to said third partial product.

16. The normal form digital filter of claim 15, wherein:
said first correction signal comprises:
said first error signal multiplied by a first factor; and
said second error signal multiplied by a second factor;
said second correction signal comprises:
said first error signal multiplied by a third factor; and
said second error signal multiplied by a fourth factor; and
said third correction signal comprises:
said first error signal multiplied by a fifth factor; and
said second error signal multiplied by a sixth factor.

17. The normal form digital filter of claim 16, wherein:
said first error signal comprises bits of said second partial products dropped by said second summer when combining said plurality of said second partial products to produce said second product; and
said second error signal comprises bits of said third partial products dropped by said third summer when combining said plurality of said third partial products to produce said third product.

18. The normal form digital filter of claim 17, wherein:
said first initial condition and said first correction signal are added together and stored in said first register during a first sample interval;
the output of said first register is added to said first partial product during a second sample interval;
said second initial condition and said second correction signal are added together and stored in said second register during said first sample period;
the output of said second register is added to said second partial product during said second sample interval;
said third initial condition and said third correction signal are added together and stored in said third register during said first sample interval; and
the output of said third register is added to said third partial product during said second sample interval.

19. A normal form digital filter comprising:
a filter input;
a filter output;
a memory addresser having a first input, a second input, a third input, and an output, wherein:
said first input is connected to said filter input; and
said addresser generates a memory address in response to signals on said first, second, and third inputs;
a first memory having an address input, a first output, a second output, and a third output, wherein:
said address input is connected to said addresser output;
said memory has a plurality of addresses; and
when said addresser outputs a memory address to said memory, said memory outputs from its corresponding address a first product word onto said first memory output, a second product word onto said second memory output, and a third product word onto said third memory output;
a first connector for connecting said first memory output to said filter output;
a second connector for connecting said second memory output to said second addresser input; and
a third connector for connecting said third memory output to said third addresser input.

20. The normal form digital filter of claim 19 wherein:
said first connector comprises a first adder for combining a plurality of said first product words;
said second connector comprises a second adder for combining a plurality of said second product words; and
said third connector comprises a third adder for combining a plurality of said third product words.

21. The digital filter of claim 20 wherein:
said filter input receives a digital input signal comprising a plurality of segments in a single sample interval;
said addresser generates a memory address in response to each of said segments;
said memory outputs a first product word, a second product word, and a third product word in response to each of said memory addresses;
said first adder combines said first product words over a single sample interval;
said second adder combines said second product words over a single sample interval; and
said third adder combines said third product words over a single sample interval.

22. The normal form digital filter of claim 21, wherein:
said first adder comprises:
first initial condition means for adding a first initial condition to said first product word; and
first error correction means for adding a first correction to said first product word;
said second adder comprises:
second initial condition means for adding a second initial condition to said second product word;
second error correction means for adding a second correction to said second product word; and
a first estimator for creating a first error estimate estimating the error generated when said second adder combines said second product words; and
said third adder comprises:
third initial condition means for adding a third initial condition to said third product word;
third error correction means for adding a third correction to said third product word; and
a second estimator for creating a second error estimate estimating the error generated when said third adder combines said third product words;
wherein:
said first initial condition means and said first error correction means simultaneously add said first initial condition and said first correction to said first product word;

said second initial condition means and said second error correction means simultaneously add said second initial condition and said second correction to said second product word; and said third initial condition means and said third error correction means simultaneously add said third initial condition and said third correction to said third product word;

said first correction comprises said first estimate multiplied by a first factor and said second estimate multiplied by a second factor;

said second correction comprises said first estimate multiplied by a third factor and said second estimate multiplied by a fourth factor; and said third correction comprises said third estimate multiplied by a fifth factor and said second estimate multiplied by a sixth factor.

23. The normal form digital filter of claim 22, wherein:

said first initial condition and said first correction are added together and stored in a first register;

the output of said first register is added to said first product word;

said second initial condition and said second correction are added together and stored in a second register;

the output of said second register is added to said second product word;

said third initial condition and said third correction are added together and stored in a third register; and the output of said third register is added to said third product word.

24. The normal form digital filter of claim 23, wherein:

said first initial condition and said first correction are added together and stored in said first register during a firt sample interval;

the output of said first register is added to said first product word during a second sample interval;

said second initial condition and said second correction are added together and stored in said second register during said first sample period;

the output of said second register is added to said second product word during said second sample interval;

said third initial condition and said third correction are added together and stored in said third register during said first sample interval; and the output of said third register is added to said third product word during said second sample interval.

25. The normal form digital filter of claim 20 wherein said filter input receives an input signal word comprising a first segment and a second segment, said filter additionally comprising:

a second memory addresser having a first input, a second input, a third input, and an output, wherein:

said first input is connected to said filter input;

said second addresser generates a second memory address in response to signals on its first, second, and third inputs;

a second memory having an address input, a first output, a second output, and a third output, wherein:

said address input is connected to said second addresser output;

said second memory has a plurality of addresses;

when said second addresser outputs a second memory address to said second memory, said second memory outputs from its corresponding address a first product word A onto a first memory output, a second product B onto a second memory output, and a third product word C onto a third memory output;

and wherein:

said first adder is connected to said first memory output of said first memory and to said first memory output of said second memory to combine said first product word from said first memory and said first product word A from said second memory into a first filter product word;

said second adder is connected to said second memory output of said first memory and to said second memory output of said second memory to combine said second product word from said first memory and said second product word B from said second memory into a second filter product word; and said third adder is connected to said third memory output of said first memory and to said third memory output of said second memory to combine said third product word from said first memory and said third product word C from said second memory into a third filter product word;

said second filter product word comprises a first segment and a second segment;

said third filter product word comprises a first segment and a second segment;

said filter input is connected to said first inputs of said first and second addressers so that said first addresser receives said first segment of said input signal word and said second addresser receives said second segment of said input signal word;

the output of said second adder is connected to said second inputs of said first and second addressers so that said first addresser receives said first segment of said second filter product word and said second addresser receives said second segment of said second filter product word and the output of said third adder is connected to aid third inputs of said first and second addressers so that said first addresser receives said first segment of said third filter product word and said second addresser receives said second segment of said third filter product word.

26. The normal form digital filter of claim 20, wherein:

said first adder comprises:

first initial condition means for adding a first initial condition to said first product word; and first error correction means for adding a first correction to said first product word; said second adder comprises:

second initial condition means for adding a second initial condition to said second product word;

said error correction means for adding a second correction to said second product word; and a first estimator for creating a first error estimate estimating the error generated when said second adder combines said second product words; and said third adder comprises:

third initial condition means for adding a third initial condition to said third product word;

third error correction means for adding a third correction to said third product word; and a second estimator for creating a second error estimate estimating the error generated when said third adder combines said third product words; wherein:

said first initial condition means and said first error correction means simultaneously add said first initial condition and said first correction signal to said first product word;

said second initial condition means and said second error correction means simultaneously add said second initial condition and said second correction signal to said second product word;

said third initial condition means and said third error correction means simultaneously add said third initial condition and said third correction signal to said third product word;

said first correction signal comprises said first estimate multiplied by a first factor and said second estimate multiplied by a second factor;

said second correction signal comprises said first estimate multiplied by a third factor and said second estimate multiplied by a fourth factor; and said third correction signal comprises said first estimate multiplied by a fifth factor and said second estimate signal multiplied by a sixth factor.

27. The normal form digital filter of claim 26, wherein:

said first initial condition and said first error correction signal are added together and stored in a first register;

the output of said first register is added to said first product word;

said second initial condition and said second error correction signal are added together and stored in a second register;

the output of said second register is added to said second product word;

said third initial condition and said third error correction signal are added together and stored in a third register; and the output of said third register is added to said third product word.

28. The normal form digital filter of claim 27, wherein:

said first initial condition and said first error correction are added together and stored in said first register during a first sample interval;

the output of said first register is added to said first product word during a second sample interval;

said second initial condition and said second error correction are added together and stored in said second register during said first sample period;

the output of said second register is added to said second product word during said second sample interval;

said third initial condition and said third error correction signal are added together and stored in said third register during said first sample interval; and the output of said third register is added to said third product word during said second sample interval.

29. A normal form digital filter comprising:

a filter input for receiving digital input signals, each comprising a plurality of bits;

a filter output;

a plurality of memory addressers, wherein:

each of said addressers has a first input connected to said filter input to receive a segment comprising one or more bits of each of said input signals;

each of said addressers additionally includes a second input and a third input;

each of said addressers generates a memory address in response to signals on said first, second, and third inputs;

each of said addressers further includes an output;

a plurality of memories, each having first, second, and third outputs and an address input, wherein:

said address input of each memory is connected to the output of a corresponding one of said addressers;

each of said memories includes a plurality of addresses, each corresponding to an address output by said corresponding addresser;

stored at each of said addresses are first, second, and third partial products;

each of said memories has said first, second, and third outputs;

said first, second, and third partial products are output on said first, second, and third outputs, respectively;

a first adder having a plurality of inputs, each connected to one of said first memory outputs and having a first adder output connected to said filter output, wherein said first adder combines said first partial products;

a second adder having a plurality of inputs, each connected to one of said second memory outputs and having a second adder output connected to said second addresser inputs, wherein said second adder combines said second partial products; and a third adder having a plurality of inputs, each connected to one of said third memory outputs and having a third adder output connected to said third addresser inputs, wherein said third adder combines said third partial products.

* * * * *